(12) United States Patent
Lee et al.

(10) Patent No.: US 11,290,120 B2
(45) Date of Patent: Mar. 29, 2022

(54) RESISTIVE SENSOR BASED DATA ACQUISITION SYSTEM USING LOW DISTORTION ANALOG FRONT-END AND DIGITAL GAIN ERROR CORRECTION

(71) Applicant: Cirrus Logic International Semiconductor Ltd., Edinburgh (GB)

(72) Inventors: Seung Bae Lee, Austin, TX (US); John L. Melanson, Austin, TX (US); Anindya Bhattacharya, Austin, TX (US); Prashanth Drakshapalli, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/987,254

(22) Filed: Aug. 6, 2020

(65) Prior Publication Data
US 2022/0045689 A1     Feb. 10, 2022

(51) Int. Cl.
| | |
|---|---|
| *H03M 1/12* | (2006.01) |
| *H03M 1/38* | (2006.01) |
| *H03M 1/08* | (2006.01) |
| *H03M 1/06* | (2006.01) |
| *H03M 1/10* | (2006.01) |

(52) U.S. Cl.
CPC .......... *H03M 1/38* (2013.01); *H03M 1/0607* (2013.01); *H03M 1/089* (2013.01); *H03M 1/1047* (2013.01)

(58) Field of Classification Search
CPC ..... H03M 1/38; H03M 1/0607; H03M 1/1047
USPC .......................................... 341/155, 120, 118
See application file for complete search history.

(56) References Cited

U.S. PATENT DOCUMENTS

| 10,690,730 B2 | 6/2020 | Kimball |
|---|---|---|
| 2007/0247141 A1* | 10/2007 | Pastre .................. G01R 33/075 324/202 |
| 2022/0043077 A1 | 2/2022 | Drakshapalli et al. |

OTHER PUBLICATIONS

Mosser, Vincent et al. "A Spinning Current Circuit for Hall Measurements Down to the Nanotesla Range." *IEEE Transactions on Instrumentation and Measurement*. vol. 66, No. 4, Apr. 2017. pp. 637-650.

* cited by examiner

*Primary Examiner* — Peguy Jean Pierre
(74) *Attorney, Agent, or Firm* — E. Alan Davis; James W. Huffman

(57) ABSTRACT

A data acquisition system (DAS) for processing an input signal from a resistive sensor (e.g., Hall effect sensor) includes a sensor signal path that digitizes the input signal. An input impedance of the sensor signal path attenuates the input signal. A gain error corrector applies a gain error correction factor in a digital domain of the DAS to the digitized input signal to compensate for a loading effect to the resistive sensor. The sensor signal path includes an inverting amplifier that provides low distortion for the input signal and an ADC (e.g., delta-sigma, SAR, pipelined, auxiliary) that digitizes the input signal. A sensor characterization path digitizes the sensor resistance which the gain error corrector uses, along with the inverting amplifier input impedance, to calculate the gain error correction factor.

20 Claims, 4 Drawing Sheets

RESISTIVE SENSOR BASED DATA ACQUISITION SYSTEM USING LOW DISTORTION ANALOG FRONT-END AND DIGITAL GAIN ERROR CORRECTION

BACKGROUND

The field of representative embodiments of this disclosure relates to methods, devices, and circuits concerning resistive sensor-based data acquisition systems.

A typical resistive sensor-based data acquisition system 10, as shown in FIG. 1, has a sensor element 15 and an integrated data acquisition integrated circuit (IC). A typical data acquisition IC has a current source to bias the sensor element 15 and a sensor signal path 11 comprising a differential non-inverting amplifier 14, a programmable gain amplifier (PGA) 12, a filter 13, and an analog-to-digital converter (ADC) 16 to acquire the voltage developed across the terminals of the sensor 15. In FIG. 1, the current source is shown as a Thevenin equivalent voltage source $V_{THEVENIN}$ in series with a Thevenin equivalent resistance $R_{THEVENIN}$ that produces current Islas.

As discussed in the above section, a non-inverting preamplifier is preferable for a resistive sensor such as a Hall sensor and a strain sensor because of its high input impedance. However, it is difficult to achieve a gain of less than or equal to one with the non-inverting amplifier, and the non-inverting amplifier also suffers from higher distortion than an inverting amplifier.

SUMMARY

In one embodiment, the present disclosure provides a data acquisition system (DAS) for processing an input signal from a resistive sensor. The DAS includes a sensor signal path that digitizes the input signal. An input impedance of the sensor signal path attenuates the input signal. The DAS also includes a gain error corrector that applies a gain error correction factor in a digital domain of the DAS to the digitized input signal to compensate for a loading effect to the resistive sensor.

In another embodiment, the present disclosure provides a method for using a data acquisition system (DAS) to process an input signal from a resistive sensor. The method includes digitizing, by a sensor signal path of the DAS, the input signal. An input impedance of the sensor signal path attenuates the input signal from the resistive sensor. The method also includes applying, in a digital domain, a gain error correction factor to the digitized input signal to compensate for a loading effect to the resistive sensor.

In yet another embodiment, the present disclosure provides a method using a system to measure a signal from a Hall effect sensor. The system has a measurement resistance that attenuates the signal from the Hall effect sensor. The method includes measuring the signal from the Hall effect sensor, measuring a resistance of the Hall effect sensor, calculating a gain error correction factor as a function of the measurement resistance of the system and the measured resistance of the Hall effect sensor, and applying the gain error correction factor to the measured signal from the Hall effect sensor.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 2:
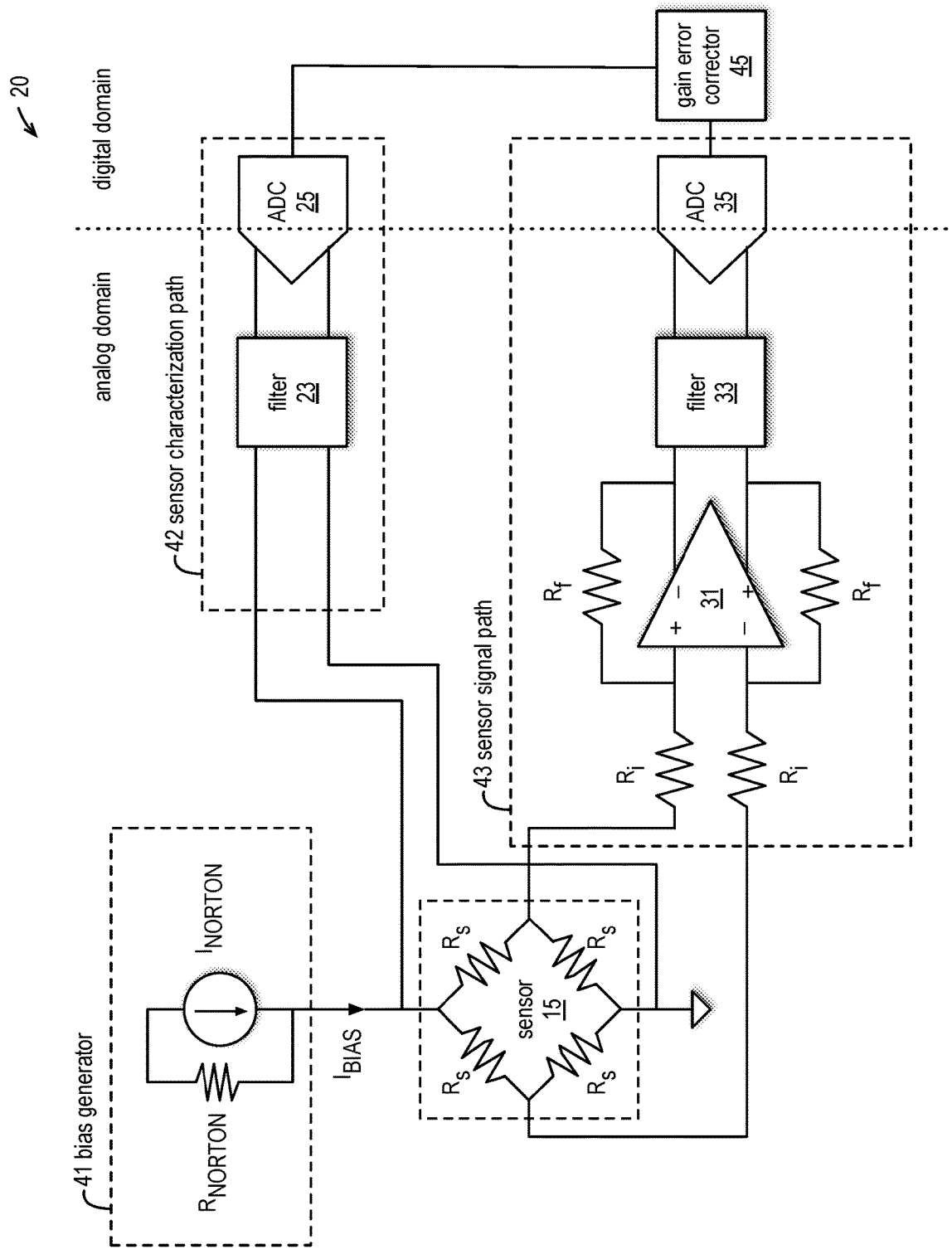
FIG. 2 is an example low distortion data acquisition system data acquisition system using a differential inverting amplifier for a resistive sensor with digital gain error correction in accordance with embodiments of the present disclosure.

FIG. 2 is an example low distortion data acquisition system (DAS) 20 using a differential inverting amplifier for a resistive sensor with digital gain error correction in accordance with embodiments of the present disclosure. A bias generator 41 provides a constant bias current Islas to a resistive sensor 15. In FIG. 2, the bias generator 41 is shown as a Norton equivalent current source $I_{NORTON}$ in parallel with a Norton equivalent resistance $R_{NORTON}$ that produces current $I_{BIAS}$. The resistive sensor 15 is connected to a sensor characterization path 42 that digitizes, or measures, a resistance, $R_S$, of the sensor 15. Preferably, $R_{NORTON}$ is much larger than $R_S$ such that $I_{BIAS}$ is close to $I_{NORTON}$. In the embodiment of FIG. 2, the sensor characterization path 42 includes a filter 23 connected to top and bottom terminals of the sensor 15 and an ADC 25 that receives the output of the filter 23. In the embodiment of FIG. 2, the sensor characterization path 42 measures the voltage between the top and bottom terminals of the sensor 15 which the ADC 25 provides to a gain error corrector 45. The gain error corrector 45 calculates the sensor resistance $R_S$ as the quotient of the measured voltage of the sensor 15 and the bias current $I_{BIAS}$. The filter 23 may include an amplifier that amplifies the measured voltage of the sensor 15. The ADC 25 may be a delta-sigma ADC, a successive approximation register (SAR) ADC, a pipelined ADC, or an auxiliary ADC for digitizing the resistance $R_S$ of the sensor 15.

The resistive sensor 15 is also connected to a sensor signal path 43 that receives a voltage output signal of the sensor 15. An inverting amplifier 31 of the sensor signal path 43 scales and filters the voltage output signal of the sensor 15. The inverting amplifier 31 has an input resistor $R_i$ and feedback resistor $R_f$. The input resistor $R_i$ attenuates the signal from the sensor 15 and may also be referred to as a measurement resistance. The inverting amplifier 31 may also be referred to as an analog front end (AFE). The scaled and filtered signal is filtered by a filter 33 of the sensor signal path 43 and digitized, or measured, by an ADC 35 of the sensor signal path 43. When the sensor 15 output is scaled by the inverting amplifier 31, a resistance of the sensor 15 is loaded in the analog domain in the inverting amplifier 31 and results in a gain error. The gain error corrector 45 uses the digitized resistance $R_S$ of the sensor 15 provided by the ADC 25 of the sensor characterization path 42, as well as the input resistance to determine a gain error compensation factor to use to compensate the digitized signal in the digital domain for the loading effect of the sensor 15, as described in more below with respect to FIGS. 4 and 5. The ADC 35 may be a delta-sigma ADC, a successive approximation register (SAR) ADC, a pipelined ADC, or an auxiliary ADC for digitizing the input signal from the sensor 15.

Figure 3:
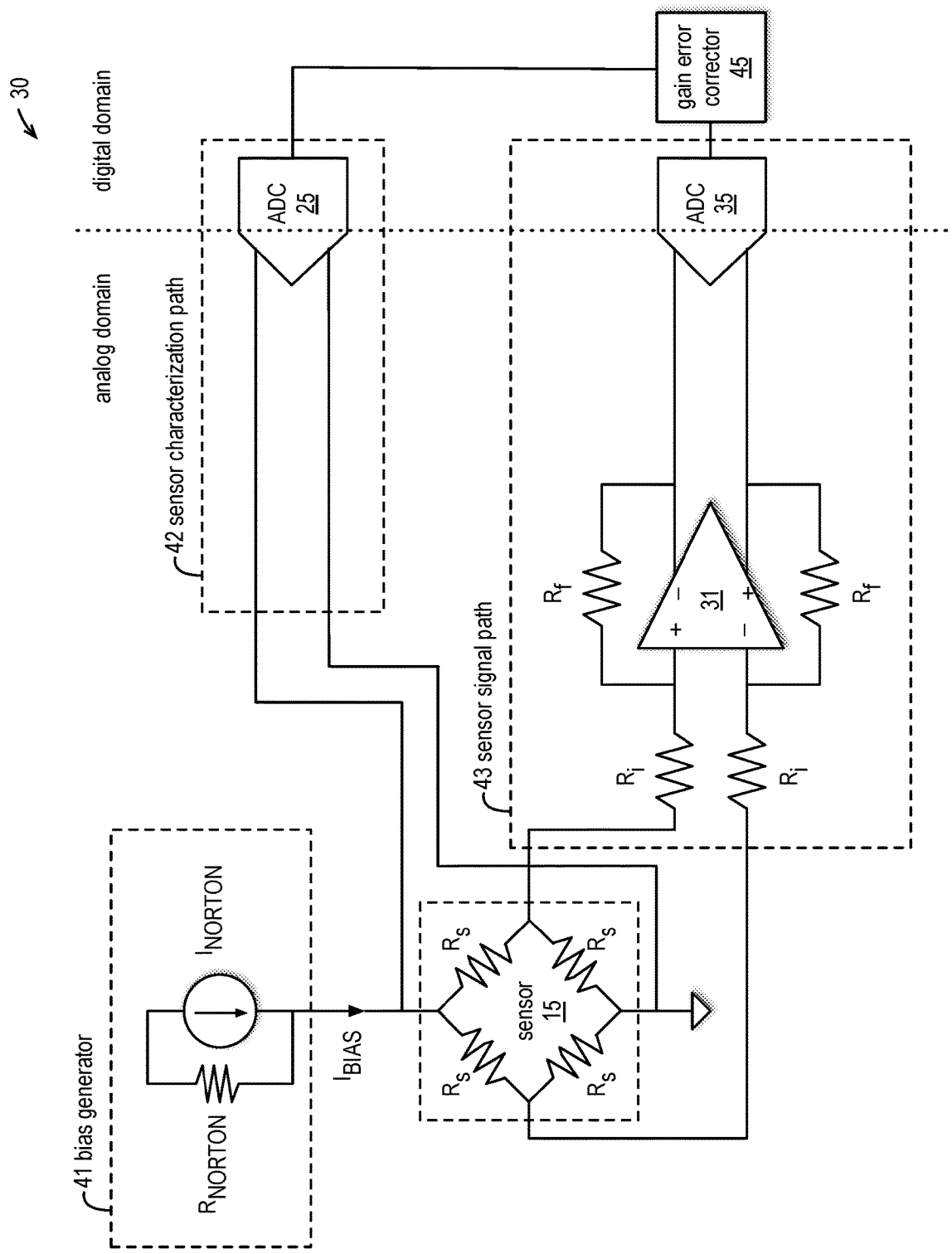
FIG. 3 is an example low distortion data acquisition system data acquisition system using a differential inverting amplifier for a resistive sensor with digital gain error correction in accordance with embodiments of the present disclosure.

FIG. 3 is an example low distortion DAS 30 using an inverting amplifier for a resistive sensor with digital gain error correction in accordance with an alternate embodiment of the present disclosure. The DAS 30 of FIG. 3 is similar in many respects to the DAS 20 of FIG. 2. However, the filters 23 and 33 of FIG. 2 are absent in the embodiment of FIG. 3. That is, the ADC 25 of the sensor characterization path digitizes an unfiltered version of $R_S$, and the ADC 35 of the sensor signal path 43 digitizes an output of analog sensor 15 signal by the inverting amplifier 31. The embodiment of FIG. 3 may save area and power over the embodiment of FIG. 2.

Figure 4:
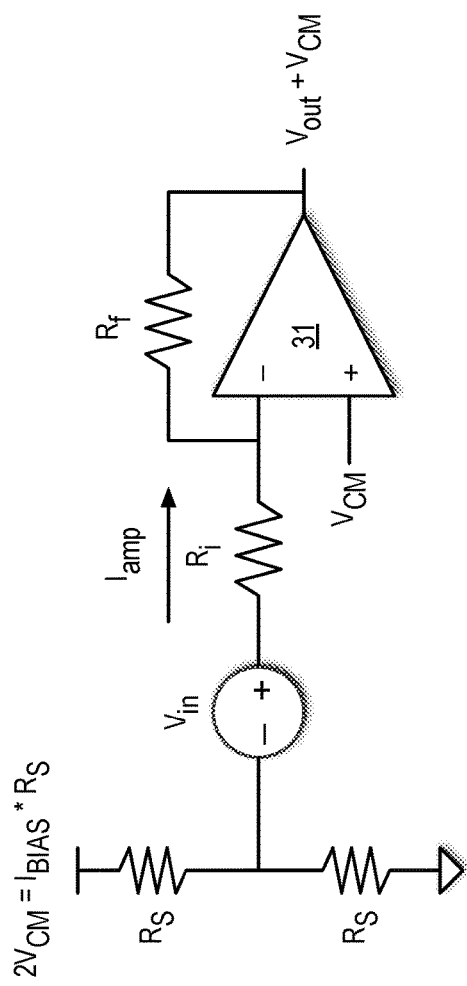
FIG. 4 is an example half-circuit portion of a resistive sensor model and an inverting amplifier for use in analyzing a gain error correction method in accordance with embodiments of the present disclosure.

FIG. 4 shows a half-circuit portion of a resistive sensor model and an inverting amplifier 31 for use in analyzing a gain error correction method, e.g., according to embodiments of the systems 20 and 30 of FIGS. 2 and 3, in accordance with embodiments of the present disclosure. Resistor $R_S$ is the resistance of the sensor 15 and voltage $V_{in}$ is the output voltage of the sensor 15 which generates a current $I_{amp}$ to the inverting amplifier 31. Twice the common mode voltage $V_{CM}$ is the product of the resistor $R_S$ and the bias current $I_{BIAS}$.

Figure 5:
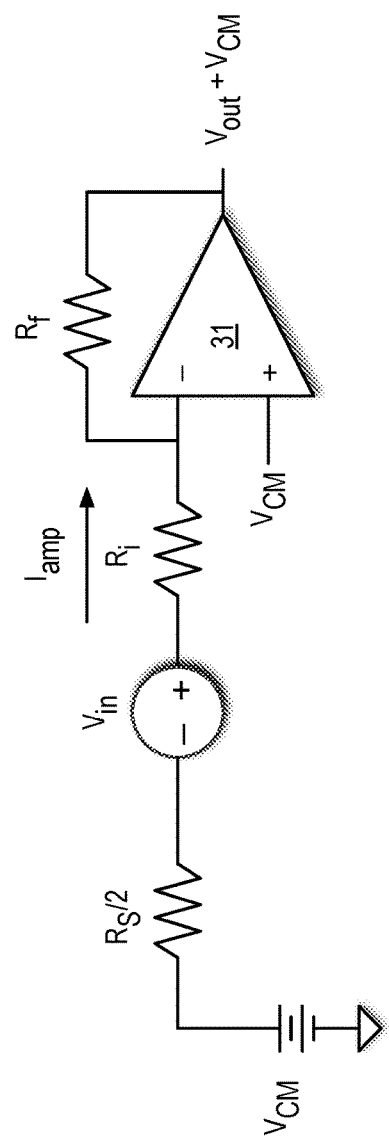
FIG. 5 is an example Thevenin equivalent circuit of the model of FIG. 4.

FIG. 5 shows the Thevenin equivalent circuit of the model of FIG. 4. The total input resistance to the inverting amplifier 31 is $R_i+(R_S/2)$ according to the Thevenin equivalent circuit, where $R_i$ is the value of the input resistor and $R_S$ is the resistance of the sensor 15.

The gain of the analog front end (AFE) may be expressed in equation (1) as $$AFE \text{ gain} = \frac{Vout}{Vin} = -\frac{Rf}{Ri + \frac{Rs}{2}}, \quad (1)$$

where $R_f$ is the value of the feedback resistor.

The ideal gain may be expressed in equation (2) as $$\text{Ideal Gain} = -\frac{Rf}{Ri} = -\frac{Rf}{Ri + \frac{Rs}{2}} \cdot \left(1 + \frac{Rs}{2Ri}\right) = AFE \text{ gain} \times \left(1 + \frac{Rs}{2Ri}\right). \quad (2)$$

Finally, the gain error correction factor may be expressed in equation (3) as $$\text{gain error correction factor} = \left(1 + \frac{Rs}{2Ri}\right). \quad (3)$$

$R_i$ is a known resistance value, and $R_S$ may be sensed from the ADC 25 of the sensor characterization path 42. Advantageously, the gain error caused by the sensor resistance, Rs, may be corrected in the digital domain, e.g., by gain error corrector 45. In one embodiment, the gain error correction performed by the gain error corrector 45 may comprise a digital signal processor, and in another embodiment the gain error corrector 45 may comprise dedicated digital arithmetic logic that may include a state machine. Preferably, the gain error corrector 45 continuously calculates the gain error correction factor and continuously applies it to the scaled (and filtered) digital version of the input signal from the sensor 15 in real time to account for temperature drift that may occur during operation of the systems 20 and 30.

Figure 1:
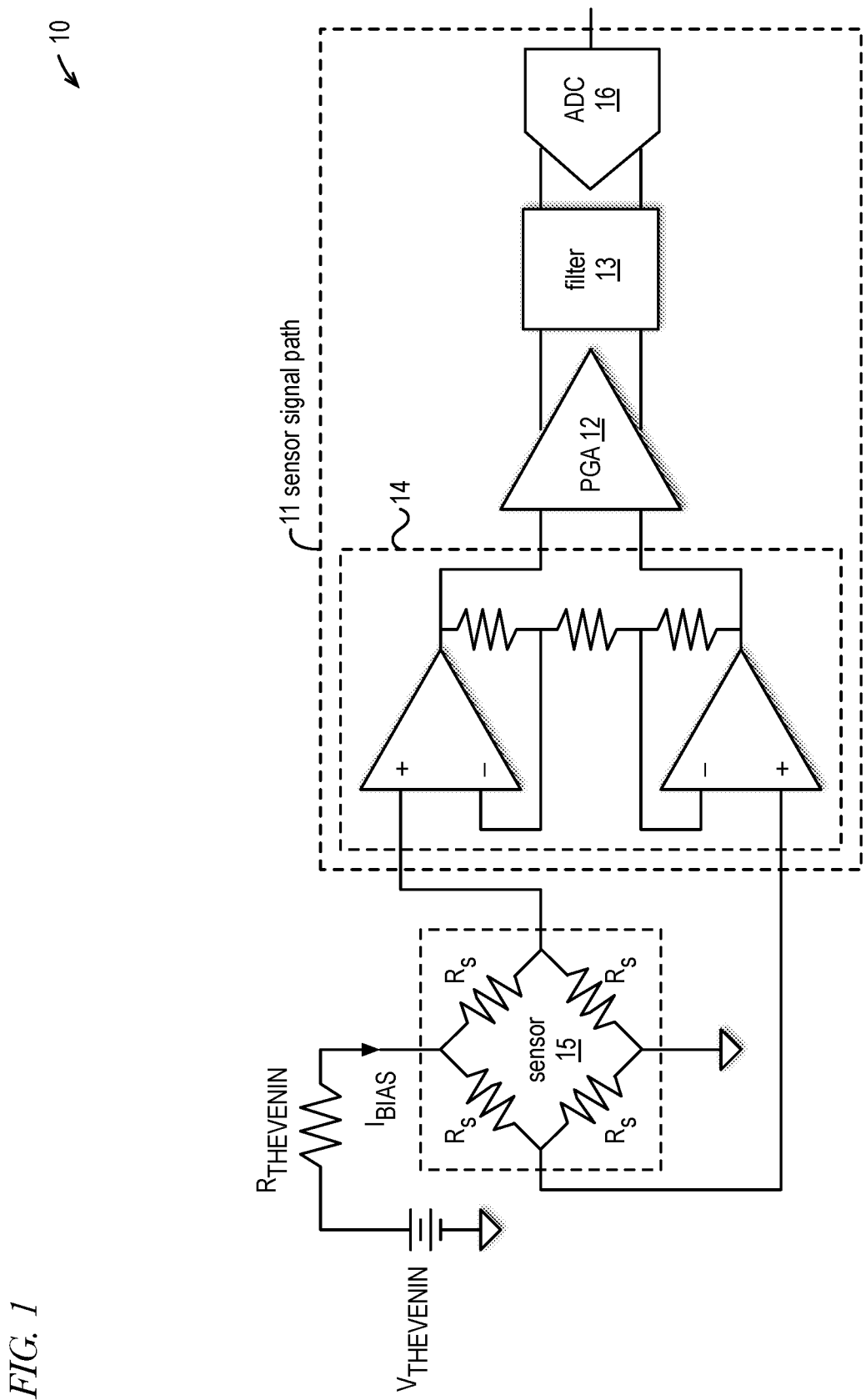
FIG. 1 is an example conventional resistive sensor-based data acquisition system.

Advantageously, the inverting amplifier 31 provides and achieves a gain of less than or equal to one. Also, the systems 20 and 30 advantageously have low distortion characteristics compared with a conventional non-inverting amplifier-based system, e.g., of FIG. 1. The conventional signal chain, e.g., of FIG. 1, may consist of multiple stages including the non-inverting preamplifier, an inverting gain stage, and a low-pass filter (LPF). In contrast, the systems 20 and 30 of FIGS. 2 and 3 may have the single gain stage 31 as in the embodiment of FIG. 3 (with an additional low pass filter 33 in the embodiment of FIG. 2), such that advantageously area and power may also be saved.

Embodiments of the present disclosure provide a method and system for using an ADC for processing an input signal from a resistive sensor. The ADC is loaded by the resistive sensor in an analog domain of the ADC. The ADC digitizes the input signal. The loading effect of the resistive sensor is compensated in a digital domain of the ADC. In one embodiment, the ADC has a gain of less than or equal to one, and the input signal is acquired by the ADC with low distortion. The ADC may alternatively have a gain of greater than one. An inverting amplifier may be used as part of an analog front-end circuit of the ADC that provides the gain and low distortion for the input signal. The amplifier may be a combination of one or more multi-stage amplifiers and filters. The ADC may be a delta-sigma ADC, a SAR ADC, or an auxiliary ADC, for enabling the ADC to accurately capture the signals. An output of the ADC is corrected for the gain by a gain error correction stage continuously in real time to account for temperature drift.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A data acquisition system (DAS) for processing an input signal from a resistive sensor, comprising:
   a sensor signal path that digitizes the input signal;
   wherein an input impedance of the sensor signal path attenuates the input signal;
   a gain error corrector that applies a gain error correction factor in a digital domain of the DAS to the digitized input signal to compensate for a loading effect to the resistive sensor;
   a sensor characterization path that characterizes a resistance of the sensor; and
   wherein the gain error corrector uses the characterized resistance of the sensor to determine the gain error correction factor.

2. The DAS of claim 1, wherein the sensor signal path comprises:
   an analog front-end circuit that comprises an inverting amplifier that provides low distortion for the input signal.

3. The DAS of claim 1, wherein the sensor signal path comprises an analog-to-digital converter (ADC).

4. The DAS of claim 3, wherein the ADC is one of the following: a delta-sigma analog-to-digital converter (ADC), a successive approximation register (SAR) ADC, a pipelined ADC, or an auxiliary ADC for digitizing the input signal.

5. The DAS of claim 1, wherein the gain error corrector further uses the input impedance of the sensor signal path to determine the gain error correction factor.

6. The DAS of claim 1, wherein the gain error corrector applies the gain error correction factor determined by the sensor characterization path to the digitized input signal continuously in real time to account for temperature drift.

7. The DAS of claim 1, wherein the sensor characterization path comprises an analog-to-digital converter (ADC).

8. The DAS of claim 7, wherein the ADC is one of the following: a delta-sigma ADC, a successive approximation register (SAR) ADC, a pipelined ADC, or an auxiliary ADC for digitizing the sensor resistance.

9. The DAS of claim 7, wherein the sensor characterization path further comprises:
   an analog front-end circuit, coupled to the ADC, that comprises an amplifier.

10. The DAS of claim 1, wherein the resistive sensor comprises a Hall effect sensor.

11. A method for using a data acquisition system (DAS) to process an input signal from a resistive sensor, comprising:
    digitizing, by a sensor signal path of the DAS, the input signal;
    wherein an input impedance of the sensor signal path attenuates the input signal from the resistive sensor;
    applying, in a digital domain, a gain error correction factor to the digitized input signal to compensate for a loading effect to the resistive sensor;
    characterizing, by a sensor characterization path of the DAS, a resistance of the sensor; and
    using the characterized sensor resistance to determine the gain error correction factor.

12. The method of claim 11, further comprising:
    using an inverting amplifier as an analog front-end circuit of the sensor signal path to provide low distortion for the input signal.

13. The method of claim 11, wherein said digitizing the input signal is performed by an analog-to-digital converter (ADC).

14. The method of claim 11, further comprising:
    further using the input impedance of the sensor signal path to determine the gain error correction factor.

15. The method of claim 11, wherein said applying the gain error correction factor to the digitized input signal comprises:
    applying the gain error correction factor characterized by the sensor characterization path to the digitized input signal continuously in real time to account for temperature drift.

16. The method of claim 11, wherein said characterizing the resistance of the sensor comprises digitizing the sensor resistance using an analog-to-digital converter (ADC).

17. The method of claim 11, wherein the resistive sensor comprises a Hall effect sensor.

18. A method using a system to measure a signal from a Hall effect sensor, comprising:
    the system having a measurement resistance that attenuates the signal from the Hall effect sensor;
    measuring the signal from the Hall effect sensor;
    measuring a resistance of the Hall effect sensor;
    calculating a gain error correction factor as a function of the measurement resistance of the system and the measured resistance of the Hall effect sensor; and
    applying the gain error correction factor to the measured signal from the Hall effect sensor.

19. The method of claim 18, wherein the system comprises an inverting amplifier that receives the signal from the Hall effect sensor, wherein the inverting amplifier has an input resistance that comprises the measurement resistance of the system.

20. The method of claim 18, wherein said applying the gain error correction factor to the measured signal from the Hall effect sensor is performed in a digital domain.

* * * * *

UNITED STATES PATENT AND TRADEMARK OFFICE
CERTIFICATE OF CORRECTION

PATENT NO. : 11,290,120 B2
APPLICATION NO. : 16/987254
DATED : March 29, 2022
INVENTOR(S) : Lee et al.

Page 1 of 1

It is certified that error appears in the above-identified patent and that said Letters Patent is hereby corrected as shown below:

In the Specification

In Column 1, Line 23, delete "Islas." and insert -- $I_{BIAS}$. --, therefor.

In Column 2, Lines 1-2, delete "data acquisition system data acquisition system" and insert -- data acquisition system --, therefor.

In Column 2, Lines 6-7, delete "data acquisition system data acquisition system" and insert -- data acquisition system --, therefor.

In Column 2, Line 32, delete "Islas" and insert -- $I_{BIAS}$ --, therefor.

In Column 3, Line 4, delete "to" and insert -- $R_i$, to --, therefor.

In Column 3, Line 64, delete "Rs," and insert -- $R_s$, --, therefor.

Signed and Sealed this
Twenty-seventh Day of September, 2022

Katherine Kelly Vidal
*Director of the United States Patent and Trademark Office*